(12) United States Patent
Sano

(10) Patent No.: US 7,687,715 B2
(45) Date of Patent: Mar. 30, 2010

(54) INTERCONNECTION STRUCTURE FOR CIRCUIT BOARDS AND TERMINAL MEMBERS

(75) Inventor: Takayuki Sano, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/213,520

(22) Filed: Jun. 20, 2008

(65) Prior Publication Data

US 2009/0020332 A1    Jan. 22, 2009

(30) Foreign Application Priority Data

Jul. 17, 2007   (JP)   ............... 2007-185196

(51) Int. Cl.
*H01R 4/02* (2006.01)
(52) U.S. Cl. .................................. 174/88 R; 174/94 R
(58) Field of Classification Search ............... 174/88 R, 174/94 R, 262; 439/377, 560, 736
See application file for complete search history.

(56) References Cited

U.S. PATENT DOCUMENTS 3,479,634 A * 11/1969 Pritulsky ............ 439/560
3,601,787 A * 8/1971 Reimer .............. 174/262
3,764,955 A * 10/1973 Ward .................. 439/377
4,384,757 A * 5/1983 Andrews et al. .......... 439/736
6,062,916 A    5/2000 Gladd et al.
6,126,457 A   10/2000 Smith et al.
6,524,117 B1   2/2003 Murakami et al.
6,942,499 B2   9/2005 Tanaka et al.

FOREIGN PATENT DOCUMENTS

JP    A-7-297562    11/1995

* cited by examiner

*Primary Examiner*—Chau N Nguyen
(74) *Attorney, Agent, or Firm*—Oliff & Berridge, PLC

(57) ABSTRACT

An interconnection structure for circuit board and terminal members improves a configuration of a terminal member to be soldered to conductors on boards, and relaxes a stress applied to soldered portions, thereby preventing the soldered portions from a problem, such as cracking. An interconnection structure for circuit boards and terminal members includes two boards positioned away from each other. A terminal support base may be disposed on at least one of the boards and provided with a plurality of juxtaposed terminal guiding-holes, and a plurality of terminal members may be soldered to conductors on the two boards, may penetrate the terminal guiding-holes in the terminal support base, and may be provided with bent portions for stress relaxation at a position where the bent portions do not contact with the terminal support base.

3 Claims, 12 Drawing Sheets

INTERCONNECTION STRUCTURE FOR CIRCUIT BOARDS AND TERMINAL MEMBERS

BACKGROUND

This invention relates to an interconnection structure for circuit boards and terminal members, and more particularly relates to an interconnection structure for a plurality of printed circuit boards and terminal members contained in an electrical junction box to be mounted on a motor vehicle.

A motor vehicle is provided with an electrical junction box mounted thereon. A plurality of printed circuit boards constituting an inner circuit are contained in the electrical junction box. In the case where conductors on the printed boards are connected to each other, opposite ends of the terminal members are soldered to the conductors on the printed boards.

Such a kind of the interconnection structure for the boards and terminal members is disclosed in JP-A-7-297562. As shown in FIG. 12 in the present application, opposite ends of each linear terminal member 3 are soldered to conductors (not shown) on two printed circuit boards 1 and 2 to connect them to each other.

However, in the interconnection structure disclosed in JP-A-7-297562, because the linear terminal members 3 are soldered to the conductors on the printed circuit boards 1 and 2, when the two printed circuit boards are shifted from each other by a load applied to one of the printed circuit boards, a great stress will be applied to the soldered portions of the terminal members and printed circuit boards 1 and 2. This will cause cracks in the soldered portions, thereby lowering reliability of the electrical junction box.

SUMMARY

In view of the above problems, an object of the present invention is to provide an interconnection structure for circuit boards and terminal members that improves a configuration of a terminal member to be soldered to conductors on circuit boards and can relax a stress applied to soldered portions and prevent the soldered portions from problems, such as cracking.

In order to achieve the above object, an interconnection structure for circuit boards and terminal members in accordance with the present disclosure includes: two circuit boards positioned away from each other, a terminal support base disposed on at least one of the circuit boards and provided with a plurality of juxtaposed terminal guiding-holes, and a plurality of terminal members soldered to conductors on the two circuit boards, penetrating the terminal guiding-holes in the terminal support base, and provided with bent portions for stress relaxation at a position where the bent portions do not contact with the terminal support base.

According to the interconnection structure for the circuit boards and terminal members constructed above, because the bent portion for stress relaxation is provided on each terminal member that is soldered to the conductors on the two circuit boards, even if one circuit board is shifted from the other circuit board, the stress applied to the terminal member can be relaxed by deflection of the bent portion. Thus, a great stress is not applied to the soldered portions that interconnect the terminal members and the conductors on the circuit boards, thereby preventing the soldered portions from problems, such as cracking, and enhancing reliability of the electrical junction box.

Because the bent portion of each terminal member do not contact with the terminal support base mounted on the circuit board, the bent portion can deflect flexibly without contacting with the terminal support base when a stress is applied to the terminal member, thereby sufficiently relaxing the stress applied to the terminal member.

Preferably, the bent portion for stress relaxation provided on each terminal member is inclined by an angle of about 65 degrees to about 80 degrees relative to the opposite connecting ends to be soldered to the conductors on the circuit boards.

As described above, because the bent portion for stress relaxation is inclined with respect to the soldered portions at the opposite connecting ends of the terminal member, it is possible to easily align heights of the opposite connecting ends of the plural terminal members and to surely connect the all terminal members to the conductors on the boards, thereby enhancing reliability of the electrical junction box.

The slant bent portion for stress relaxation can be easily formed in comparison with rectangular bent portion relative to the opposite end soldered portions. Even if the terminal member has a great width or thickness, it is possible to easily form the bent portion for stress relaxation.

Furthermore, by inclining the bent portion for stress relaxation relative to the opposite end connecting portions, it is possible to deflect the bent portion and to prevent the soldered portions from a problem, such as cracking, even if a load is applied to the terminal member in any direction.

Preferably, the terminal guiding-holes juxtaposed in the terminal support base are arranged in a different pattern at opposite longitudinal end portions of the terminal support base.

According to the above construction, even if the terminal support base is put on the circuit board in the position turned by an angle of about 180 degrees in a horizontal plane contrary to the regular position, the terminal members fixed on the terminal support base are shifted from the terminal holes in the circuit board, so that the terminal members cannot be inserted into the terminal holes in the circuit board. Thus, it is possible to prevent the terminal members in the erroneous arrangement from being connected to the conductors on the circuit boards.

In more detail, in the case where the distances between the terminal guiding-holes are different at the longitudinal end portions of the terminal support base, or in the case where there are wider and narrower terminal members, the terminal guiding-holes for penetrating the wider terminal members may be provided on the opposite longitudinal end portions of the terminal support base, or the number of the terminal guiding-holes for the wider terminal members may be different at the opposite longitudinal end portions of the terminal support base.

Preferably, in the case where the terminal support base is disposed on each of the opposite lateral end portions of the circuit boards, the same terminal support bases are opposed to each other at the opposite lateral end portions of the boards, and one of the terminal support bases may be turned by an angle of about 180 degrees relative to the other terminal support base.

According to the above construction, the terminal support bases opposed to each other at the both sides of the circuit boards are the same ones, thereby reducing a count of components and lowering a cost.

As described above, according to the present invention, because the bent portion for stress relaxation is provided on each terminal member that is soldered to the conductors on the two circuit boards and is arranged at the position where the bent portion does not contact with the terminal support base, even if one circuit board is shifted from the other circuit board, the stress applied to the terminal member can be relaxed by deflection of the bent portion. Thus, a great stress is not applied to the soldered portions that interconnect the terminal members and the conductors on the boards, thereby preventing the soldered portions from cracking and enhancing reliability of the electrical junction box.

DETAILED DESCRIPTION OF EMBODIMENTS

Figure 1A:
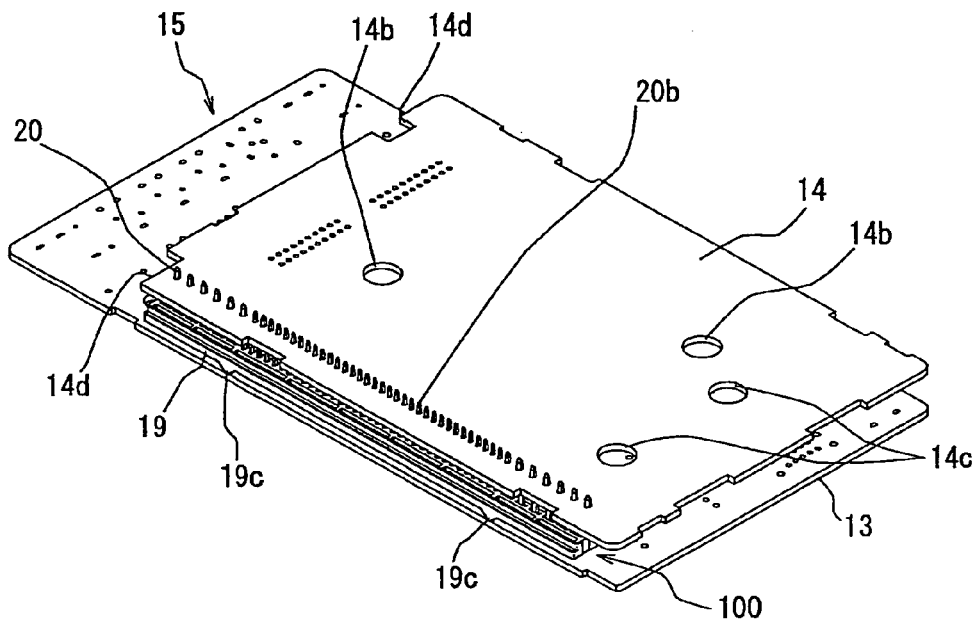
FIG. 1A is a perspective view of a first embodiment of an interconnection structure for circuit boards and terminal members in accordance with the present disclosure illustrating a bottom side of the structure.

Referring now to the drawings, embodiments of an interconnection structure for circuit boards and terminal members in accordance with the present disclosure will be described below.

FIGS. 1 to 8 show the first embodiment of the interconnection structure for the circuit boards and terminal members in accordance with the present disclosure.

Figure 12:
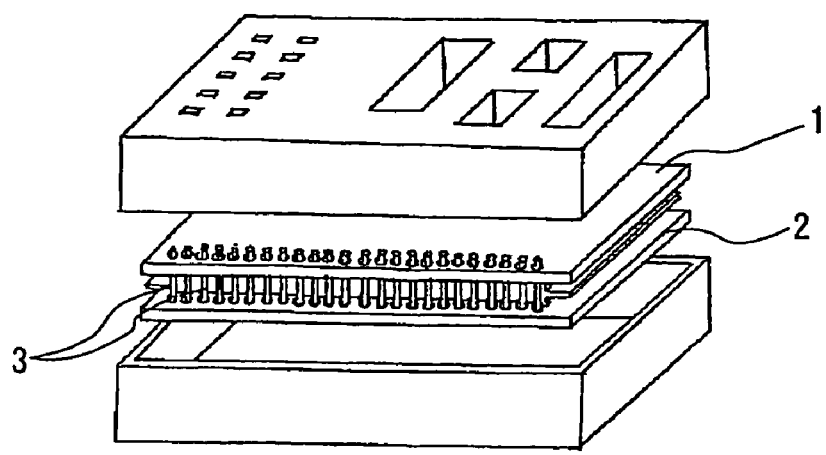
FIG. 12 is an exploded perspective view of a prior art interconnection structure for circuit boards and terminal members.

A circuit board unit 15 may include an interconnection structure for circuit boards and terminal members 100. The circuit board unit 15 may include a first printed circuit board 13, a second printed circuit board 14, and a spacer interposed between the first and second printed boards 13 and 14. Conductors (not shown) on the first and second printed circuit boards 13 and 14 may be connected through terminal members 20 to each other. The spacer 12 is omitted in FIG. 12.

Figure 5:
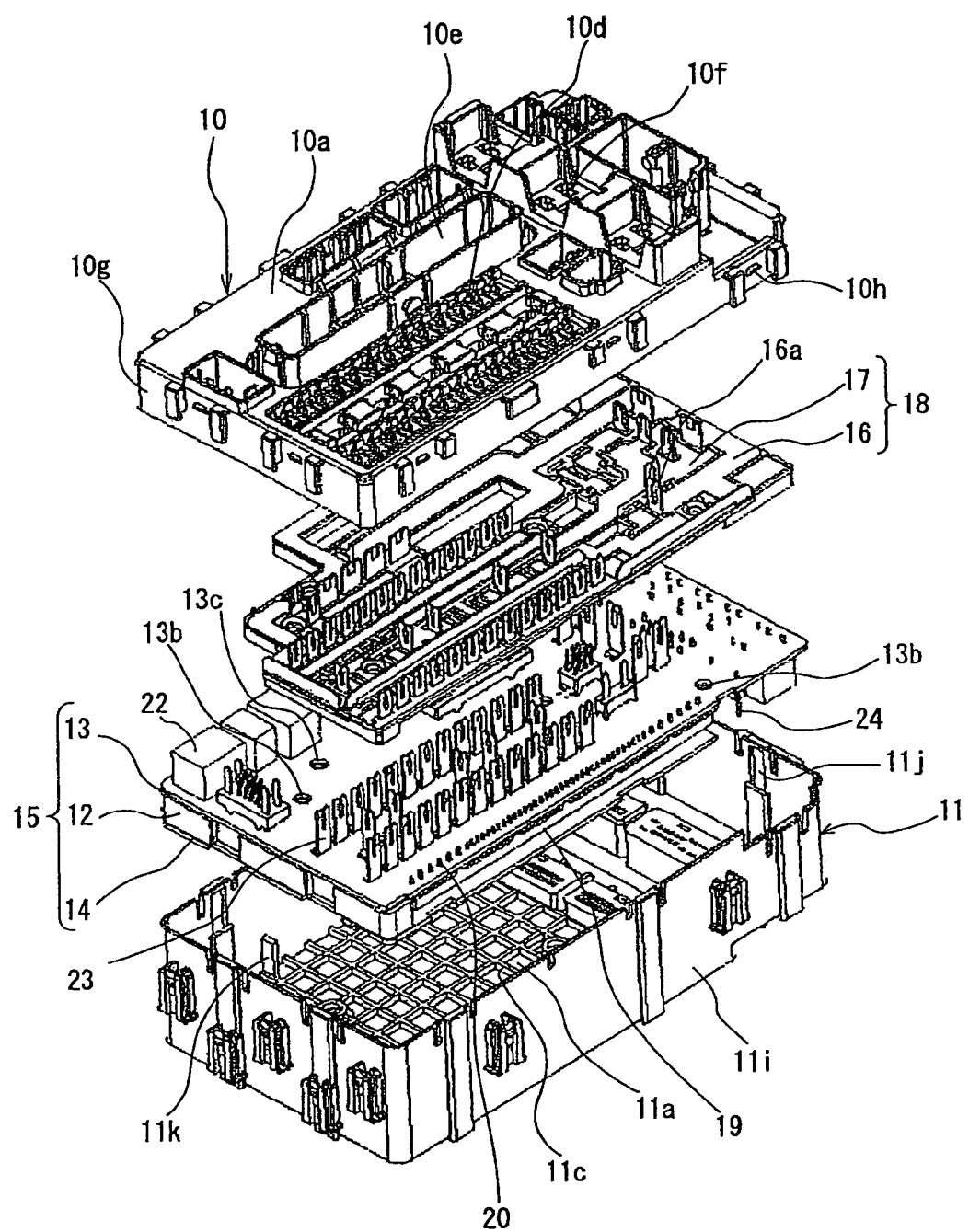
FIG. 5 is an exploded perspective view of an electrical junction box.
Figure 6A:
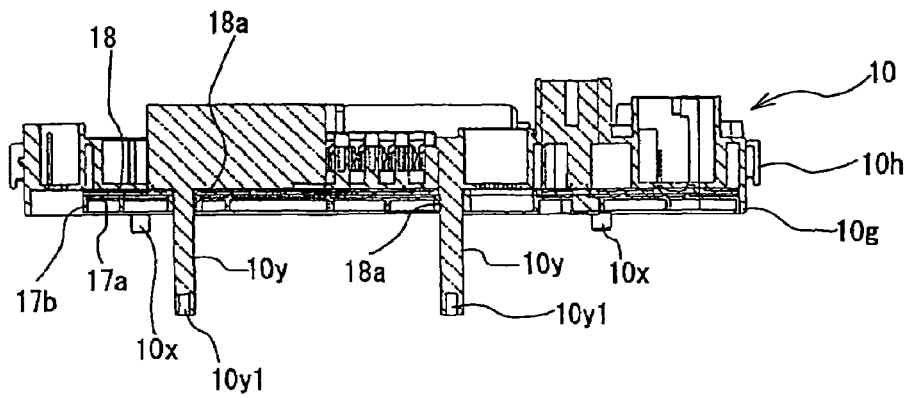
FIG. 6A is a sectional view of an upper casing, illustrating the upper casing, to which a laminated unit including bus bars and insulation plates are attached.

The circuit board unit 15 may be used as an inner circuit of the electrical junction box to be mounted on the motor vehicle. As shown in FIGS. 5 and 6, the electrical junction box may include a casing assembly having an upper casing 10 and a lower casing 11. A bus bar laminated unit 18, in which bus bars 16 and insulation plates 17 are alternately laminated, and the board unit 15 may be contained in the casing assembly so that they are arranged from the upper casing 10 to the lower casing 11.

Shorter size fixing bars 10x may be integrated with an inner surface of a top wall 10a of the upper casing 10 and may extend downward from the inner surface. The shorter size fixing bars 10x may penetrate the bus bar laminated unit 18, first printed circuit board 13, and spacer 12 to fix them on the upper casing 10 by first screws N1. Longer size fixing bars 10y may penetrate the bus bar laminated unit 18, first printed circuit board 13, spacer 12, second printed circuit board 14, and lower casing 11 to fix them on the lower casing 11 by second screws N2.

Figure 3A:
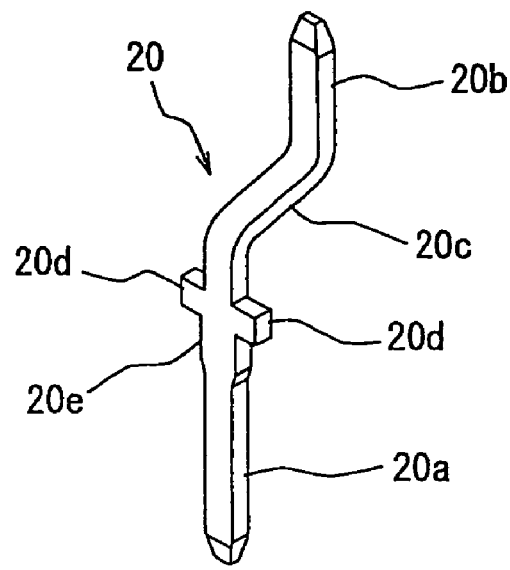
FIG. 3A is a perspective view of a terminal member, illustrating a bottom side of the member.

As shown in FIG. 3, each of the terminal members 20 that connect the conductors on the first and second printed circuit boards 13 and 14 to each other may be provided on the opposite longitudinal ends with connecting portions 20a and 20b to be soldered to the conductors on the first and second printed circuit boards 13 and 14 and on an intermediate part with a bent portion 20c for stress relaxation that is bent along a longitudinal direction of the terminal member 20.

Figure 3B:
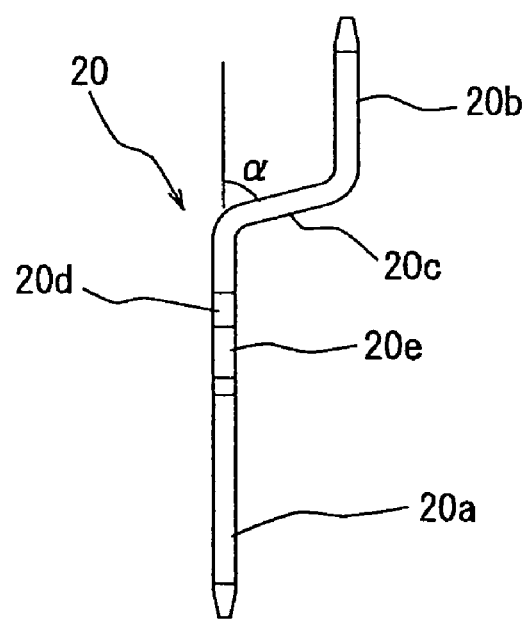
FIG. 3B is a side elevation view of the terminal member shown in FIG. 3A.

As shown in FIG. 3B, the bent portion 20c of the terminal member 20 may be bent by an inclined angle α of about 65 degrees to about 80 degrees (about 75 degrees in the first embodiment) relative to the opposite end connecting portions 20a and 20b of the terminal members 20. Consequently, the terminal member 20 can deflect even if a stress is applied to the terminal member 20 in any direction, thereby absorbing and relaxing a stress applied to the terminal member 20 by the bent portion 20c. Engaging projections 20d may be provided on the opposite lateral end side surfaces of the terminal member 20 between the bent portion 20c and the connecting portion 20a. A reinforcing portion 20e may be provided on the terminal member 20 below the engaging projections 20d at the side of the connecting portion 20a. A width of the reinforcing portion 20e may be greater than those of the connecting portions 20a and 20b.

Figure 1B:
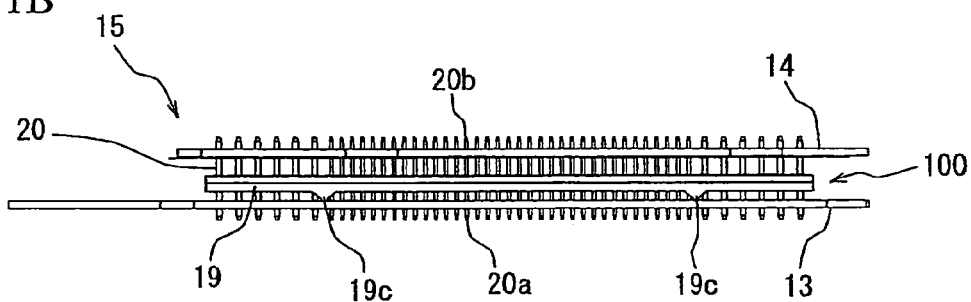
FIG. 1B is a front elevation view of the structure shown in FIG. 1A.
Figure 1C:
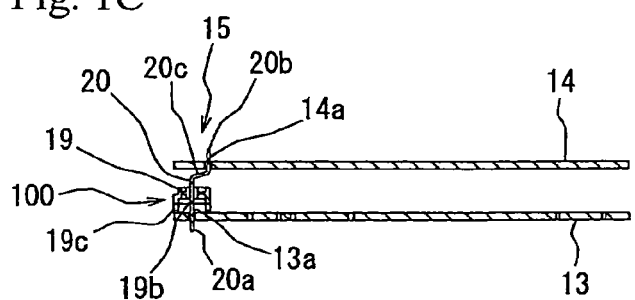
FIG. 1C is a sectional view of the structure shown in FIG. 1A.
Figure 2A:
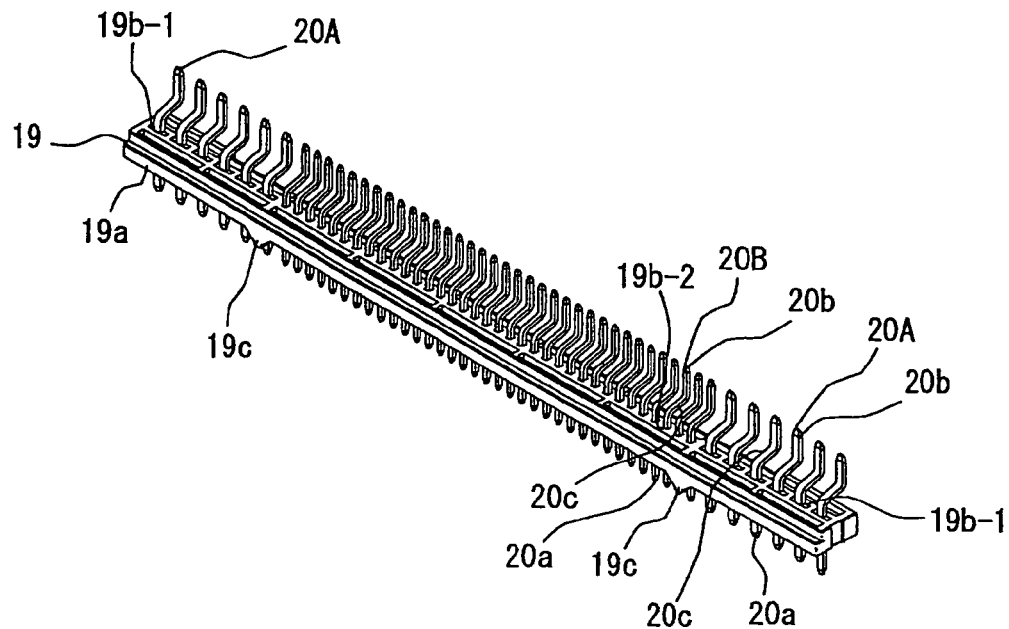
FIG. 2A is a perspective view of a terminal support base on which the terminal members are fixed, illustrating a bottom side of the base.
Figure 2B:
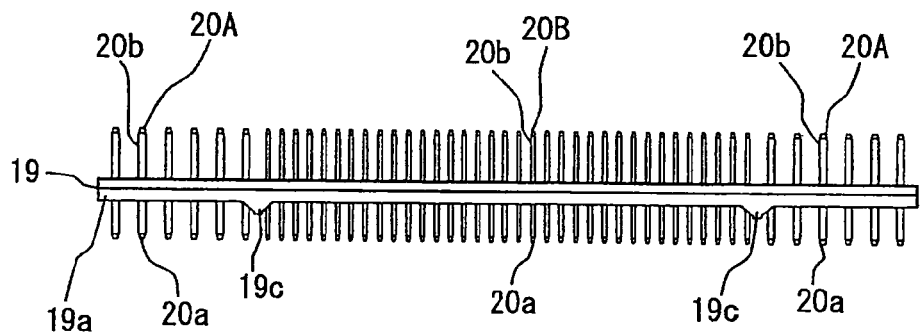
FIG. 2B is a front elevation view of the base shown in FIG. 2A.
Figure 2C:
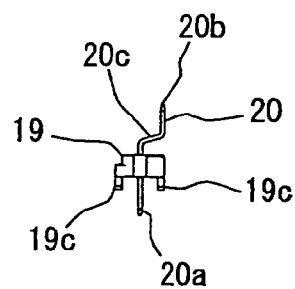
FIG. 2C is a side elevation view of the base shown in FIG. 2A.

In the first embodiment, two kinds of terminal members including a wider terminal member 20A and a narrower terminal member 20B (see FIGS. 2A, 2B) are used. In FIGS. 1 to 3, the terminal members 20 are turned in the upside down position contrary to the position where the terminal members 20 are contained in an electrical junction box.

Figure 4A:
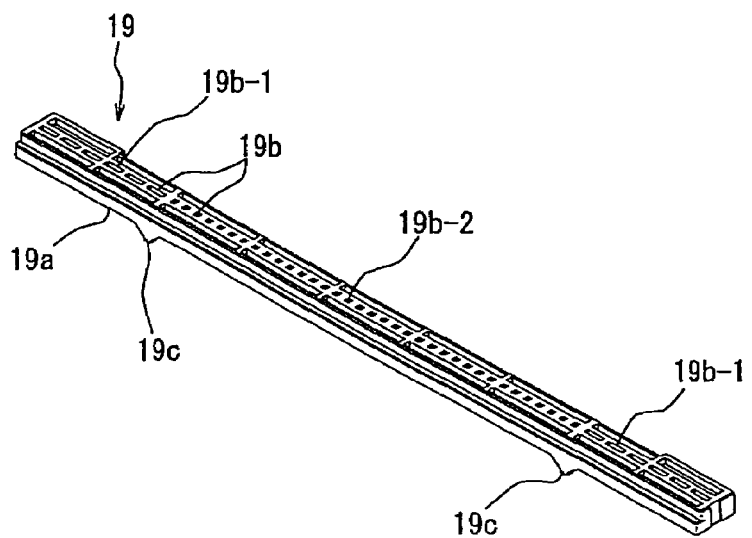
FIG. 4A is a perspective view of the terminal support base, illustrating a bottom side of the base.
Figure 4B:
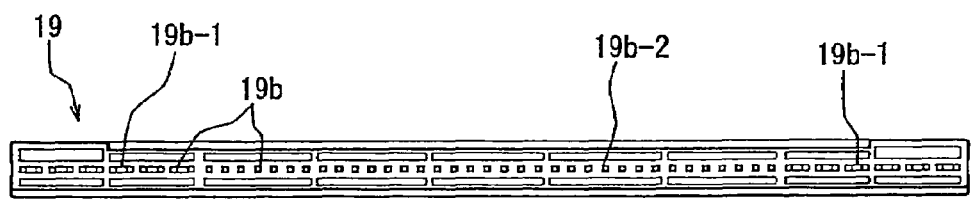
FIG. 4B is a bottom view of the base shown in FIG. 4A.

As shown in FIG. 4, a terminal support base 19 for fixing a plurality of terminal members 20 may include a housing 19a that may be a resin-molding product. The terminal support base 19 may be provided with a plurality of juxtaposed terminal guiding-holes 19b extending vertically. The terminal guiding-holes 19b may include wider terminal guiding-holes 19b-1 for permitting the wider terminal members 20A to pass and narrower terminal guiding-holes 19b-2 for permitting the narrower terminal members 20B to pass. The terminal support base 19 may be provided in the opposite longitudinal end portions with the wider terminal guiding-holes 19b-1 and in the intermediate portion with the narrower terminal guiding-holes 19b-2. In the first embodiment, six wider terminal guiding-holes 19b-1 are provided in each of the opposite longitudinal end portions of the terminal support base 19.

Also, the terminal support base 19 may be provided on a side end surface opposed to the first printed circuit board 13 with a plurality of support legs 19c to be mounted on the first printed board 13.

In FIG. 4, the terminal support base 19 is turned in an upside down position contrary to the position where the terminal support base 19 is contained in the electrical junction box.

When the connecting portion 20b of each terminal member 20 is inserted into each terminal-guiding hole 19b in the terminal support base 19, the engaging portions 20d of each terminal member 20 engages an interior of the terminal-guiding hole 19b, and thus a plurality of terminal members 20 are fixed on the terminal support base 19. At this time, as shown in FIG. 2, the bent portion 20c of each terminal member 20 is disposed on the position where the bent portion 20c does not contact with the terminal support base 19. When a load is applied to the terminal member 20, the bent portion 20c is deflected to relax a stress.

The terminal members 20A and 20B may be inserted into and secured to the terminal guiding-holes 19b in the terminal support base 19 in accordance with sizes of the terminal guiding-holes 19b. In the first embodiment, a plurality of narrower terminal members 20B are secured to and aligned on the longitudinal intermediate portion of the terminal support base 19, while six wider terminal members 20A are secured to and aligned on each of the opposite longitudinal end portions of the terminal support base 19.

The first and second printed circuit boards 13 and 14 may also be provided with terminal holes 13a and 14a in accordance with sizes of the terminal members 20A and 20B, respectively. When the terminal support base 19 is disposed on a regular position on one side of the first printed circuit board 13, a connecting portion 20a at one longitudinal end side of each of the terminal members 20A and 20B fixed on the terminal support base 19 may be inserted into the terminal holes 13a in the first printed circuit board 13. The connecting portions 20a of the terminal members 20 inserted in the terminal holes 13a in the first printed circuit board 13 may be soldered to the conductors on the first printed circuit board 13. Furthermore, a connecting portion 20b at the other longitudinal end side of the terminal members 20 may be inserted into the terminal holes 14a in the second printed circuit board 14 and the connecting portions 20b of the terminal members 20 are soldered to the conductors on the second circuit board 14.

Figure 6B:
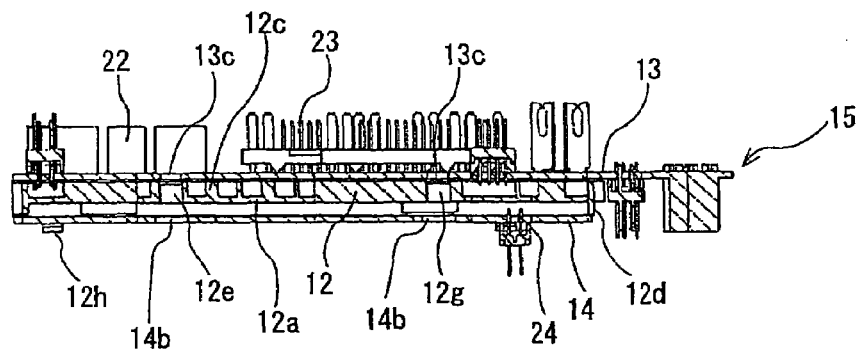
FIG. 6B is a sectional view of a board unit.

As shown in FIG. 5 and FIG. 6B, the first printed circuit board 13 may be provided with through-holes 13b and 13c that permit the shorter size fixing bars 10x and longer size fixing bars 10y to penetrate while the second printed circuit board 14 is provided with through-holes 14b that permit the longer size fixing bars 10y to penetrate. As shown in FIG. 1A, the second printed circuit board 14 may be provided with through-holes 14c and recesses 14d at positions corresponding to the shorter size fixing bars 10x.

The first printed circuit board 13 may be provided with a conductor (conductor pattern) having a great thickness enough to constitute a printed circuit board for a high current circuit.

The second printed circuit board 14 may be provided with a conductor having a smaller thickness than that of the first printed circuit board 13 enough to constitute a printed circuit board for a middle or low current circuit.

As shown in FIG. 5, the first printed circuit board 13 may be provided on the top surface with a board relay 22 disposed along a part of the peripheral edge of the top surface and may be provided on the top surface with a number of terminal members 23 soldered to the conductors.

Figure 8:
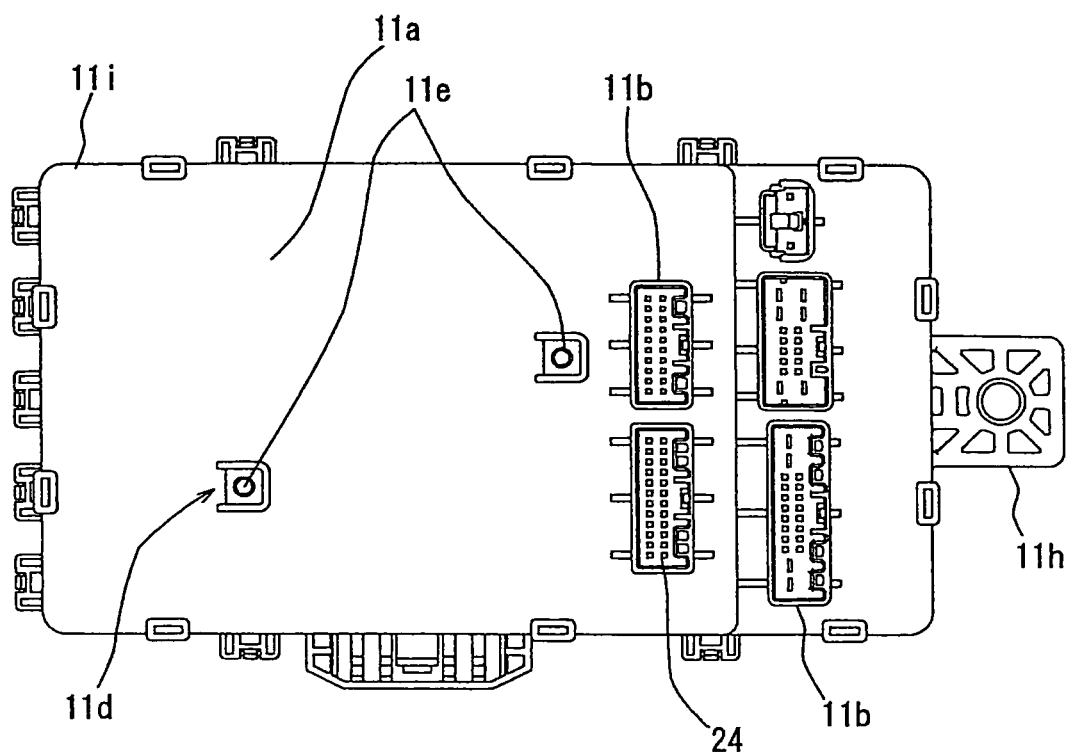
FIG. 8 is a bottom view of the lower casing.

The second printed circuit board 14 may be provided with electronic/electrical elements on the top surface that is opposed to and spaced away from the base portion 12a of the spacer 12 and on the bottom surface that is opposed to the bottom surface of the lower casing 11. The electronic/electrical elements may be connected to the conductors on the printed circuit board 14. Terminal members 24 may be soldered to the conductors on the opposite sides of the second printed circuit board 14 to project toward a connector-containing section 11b in the lower casing 11, as shown in FIG. 8.

Figure 7A:
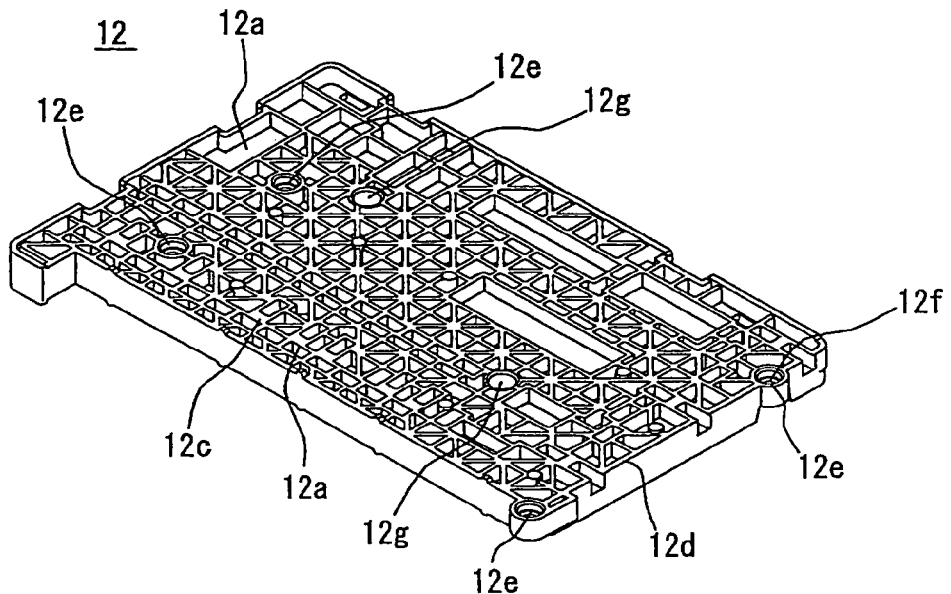
FIG. 7A is a perspective view of a spacer.
Figure 7B:
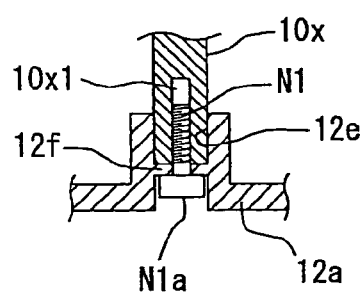
FIG. 7B is an enlarged sectional view of a main part of the spacer.
Figure 7C:
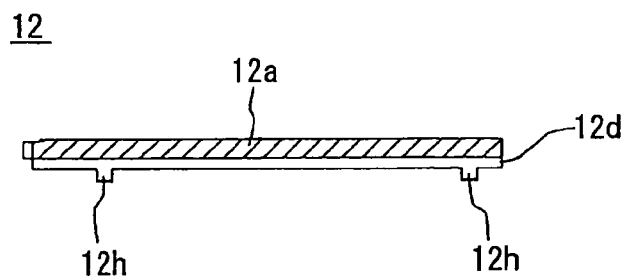
FIG. 7C is a longitudinal sectional view of the spacer taken along a long side of the spacer in FIG. 7A.

The spacer 12 may be disposed between the first printed board 13 and the second printed board 14 and may be a product made of an insulation resin material and having a configuration shown in FIG. 7. The spacer 12 may include a substantially rectangular base portion 12a and an outer peripheral frame 12d that projects in a vertical direction from an outer peripheral edge of the base portion 12a. The base portion 12a may be provided substantially on a whole top surface with substantially grid-like ribs 12c for reinforcement and prevention against deformation. As shown in FIG. 6B, the first printed circuit board 13 may be disposed on top surfaces of the ribs 12c. The base portion 12a may not be provided on a bottom surface with the ribs 12c. The second printed board 14 may be disposed on a bottom surface of the outer peripheral frame 12d.

As shown in FIG. 7A, the base portion 12a of the spacer 12 may be provided with through-holes 12e in positions corresponding to the projecting positions of the shorter size fixing bars 10x. As shown in FIG. 7B, each of the through-holes 12e may be provided on an interior with an annular flange portion 12f. A top surface of the flange portion 12f may receive a lower end surface of the shorter size fixing bar 10x while a bottom surface of the flange portion 12f may receive a head portion N1a of the first screw N1 inserted upward into the through-hole 12e. Furthermore, the spacer 12 may be provided with through-holes 12g at the positions corresponding to the projecting positions of the longer size fixing bars 10y.

In addition, engaging pawls 12h (FIG. 3c) may extend from a lower end surface on a downward projecting portion of the outer peripheral frame 12d of the spacer 12. The second printed circuit board 14 may contact with a lower end surface of the outer peripheral frame 12d. The engaging pawls 12h may lock the peripheral edge of the second printed circuit board 14.

Two cylindrical longer size fixing bars 10y may extend from an inner surface on the top wall of the upper casing 10 substantially at the opposite sides of a center of the top wall in a diagonal direction. Four shorter size fixing bars 10x may extend at the corners of the top wall. A length of each longer size fixing bar 10y may be set to reach a bottom wall 11a of the lower casing 11, while a length of each shorter size fixing bar 10x may be set to reach a base portion 12a of the spacer 12. The longer size and shorter size fixing bars 10y and 10x may be provided with threaded holes 10y1 and 10x1 at their lower end openings.

The upper casing 10 may be provided on the top wall 10a with a fuse-containing section 10d, a connector-containing section 10e, and a relay-containing section 10f to dispose terminals 16a projecting from the bus bars 16, and the terminal members 23 projecting from the first printed circuit board 13 in the respective sections.

The upper casing 10 may be provided on an exterior of a peripheral wall 10g with a locking portion 10h to be locked on the lower casing 11.

The lower casing 11 may be provided substantially on a whole top surface of the bottom wall 11a with grid-like ribs 11c for reinforcement and on an outer peripheral portion of the bottom wall 11a with longer size ribs 11k extending upward. Upper end surfaces of the longer size ribs 11k may contact with the bottom surface of the second printed circuit board 14 to perform positioning and holding functions. Recesses 11d may be provided in the bottom wall 11a of the lower casing 11 at the positions opposed to the projecting positions of the longer size fixing bars 10y. Each of the recesses 11d may be provided on a bottom wall with a fixing-hole 11e to pass the second screw N2. Lower surfaces of the longer size fixing bars 10y may be put on upper surfaces of the recesses 11d. The lower surface of each recess 11d may serve as an engaging surface with a head portion N2a of the second screw N2 to be inserted into the fixing hole 11e from the lower side.

Figure 6C:
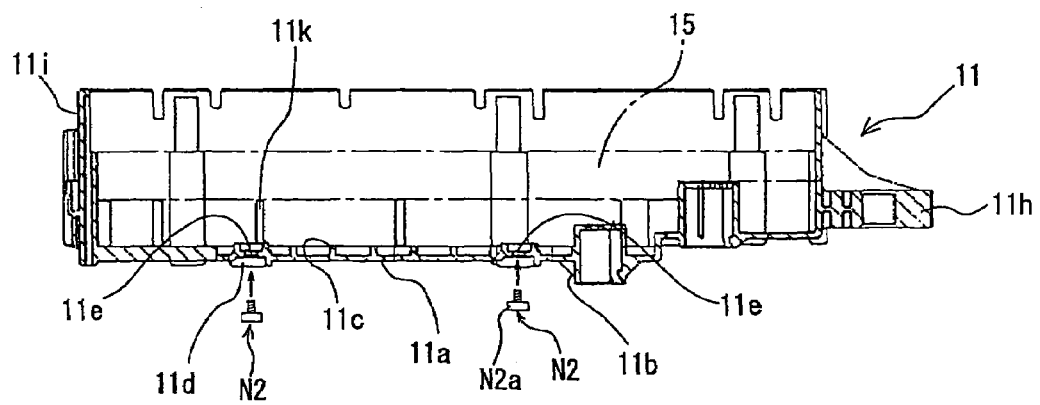
FIG. 6C is a sectional view of a lower casing.

As shown in FIG. 5 and FIG. 6C, a peripheral wall 11i of the lower casing 11 may have a height that reaches a top surface of the electrical junction box and thus the lower casing 11 may be formed into a deep box-like configuration. When the peripheral wall 11i of the lower casing 11 is fitted on the exterior of the peripheral wall 10g of the upper casing 10, the locking portions 10h on the exterior of the peripheral wall 10g may engage with a locking groove 11j provided on the peripheral wall 11i.

Next, procedures for assembling the electrical junction box will be described below.

First, the upper casing 10 may be turned in an upside down position so that the shorter size fixing bars 10x and longer size fixing bars 10y project upward, the bus bar laminated unit 18 including the bus bars 17 and insulation plates 16 may be inserted into the upper casing 10, the longer size fixing bars 10y and shorter size fixing bars 10x may be inserted into the through-holes 18a in the bus bar laminated unit 18 from the upper side, and the bus bar laminated unit 18 may be contained in the upper casing 10.

Second, the first printed board 13 may be inserted into the upper casing 10 from the upper side. The shorter size and longer size fixing bars 10x and 10y projecting from the bus bar laminated unit 18 may be inserted into the through-holes 13b and 13c in the first printed circuit board 13 from the upper side. The first printed board 13 may be disposed on the insulation plate 17 on the lowermost layer (uppermost layer in the assembling steps) of the bus bar laminated unit 18. An end of each terminal member 20 supported by the terminal support base 19 may then be soldered to the conductors on the first printed board 13. At this time, the terminal support base 19 may be disposed above the first printed circuit board 13.

Then, the spacer 12 may be inserted into the upper casing 10 from the upper side. The longer size fixing bars 10y may be inserted into the through-holes 12g in the spacer 12. The shorter size fixing bars 10x may be inserted into the fixing holes 12e in the spacer 12. The lower end surfaces (upper end surfaces in the assembling steps) of the shorter size fixing bars may contact with the flanges 12f in the fixing holes 12e. Under this condition, the first screws N1 may be inserted into the fixing holes 12e and screwed into the threaded holes 10x1 in the shorter size fixing bars 10x.

Thus, the bus bar laminated unit 18 may be contained in the upper casing 10 to project from the casing 10, and the first printed circuit board 13 and spacer 12 stacked on and secured to the bus bar laminated unit 18.

Then, the second printed circuit board 14 may be inserted into the upper casing 10 from the upper side. The longer size fixing bars 10y may be inserted into the through-holes 14a in the second printed circuit board 14. The second printed circuit board 14 may be put on the distal end of the outer peripheral frame 12d of the spacer 12. The engaging pawls 12h projecting from the outer peripheral frame 12d may lock the second printed circuit board 14. Under this condition, the connecting portion 20b of the other end of each terminal member 20 may be soldered to the conductors on the second printed board 14.

Finally, the lower casing 11 may be mounted on the upper casing 10 from the upper side. The peripheral wall 10g of the upper casing 10 may be fitted on the interior of the peripheral wall 11i of the lower casing 11. The lower end surfaces of the longer size fixing bars 10y may contact with the upper surfaces of the recesses 11d around the fixing holes 11e in the lower casing 11. Under this condition, the second screws N2 may be inserted into the fixing holes 11e in the lower casing 11 from the upper side and screwed into the threaded holes 10y1 in the longer size fixing bars 10y. The peripheral wall 10g of the upper casing 10 may be fitted on the interior of the peripheral wall 11i of the lower casing 11, and the locking portions 10h may couple the locking grooves 11j to each other.

In the above assembling procedures, in the case where, for example, a step of stacking the first printed circuit board 13 on the second printed circuit board 14 may be carried out at a remote factory. The bus bar laminated unit 18, first printed board 13, and spacer 12 can be firmly secured to the upper casing 10 by means of fastening the first screws N1 into the shorter size fixing bars. Accordingly, it is possible to prevent the respective components from being detached or shifted from one another when the assembled unit is transmitted to another remote factory.

According to the above construction, because the bent portion 20c for stress relaxation may be provided on the intermediate part of the terminal member 20, in which the opposite ends are soldered to the conductors on the first and second printed circuit boards 13 and 14, even if a load is applied to the terminal member 20 or the first and second printed circuit boards 13 and 14 are shifted from each other upon assembling the first and second printed circuit boards 13 and 14, the stress applied to the terminal member 20 can be relaxed by deflection of the bent portion 20c. Thus, a great load is not applied to the soldered portions that interconnect the terminal members 20 and the conductors on the first and second printed circuit boards 13 and 14, thereby preventing the soldered portions from a problem, such as cracking, and enhancing reliability of the electrical junction box.

Because the bent portions 20c of the terminal members 20 do not contact with the terminal support base 19 so that the bent portions 20c can deflect flexibly, it is possible to sufficiently relax the stress applied to the terminal members 20.

Figure 9A:
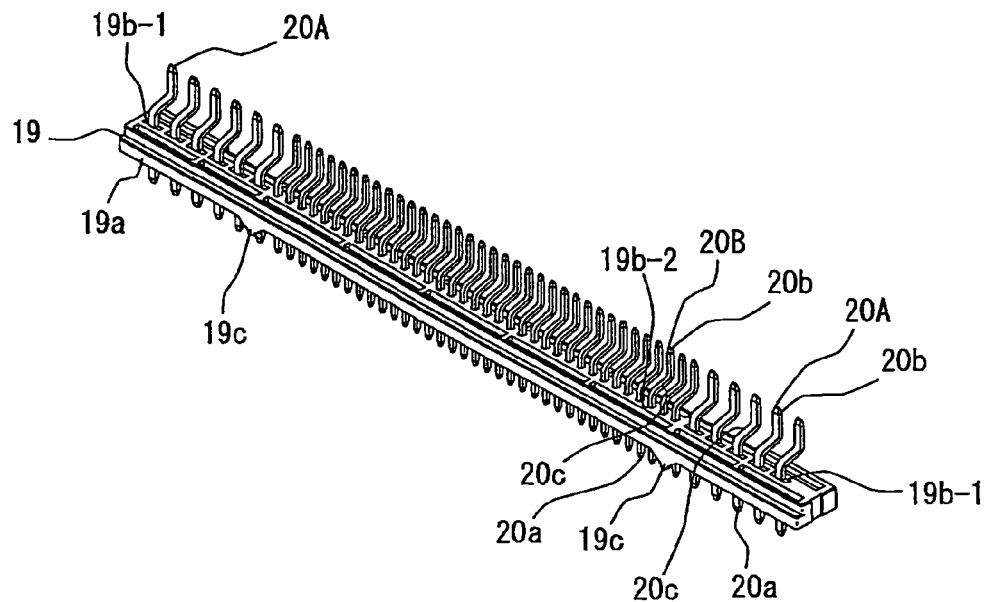
FIG. 9A is a perspective view of a terminal support base according to a second embodiment, illustrating the view similar to FIG. 2A.
Figure 9B:
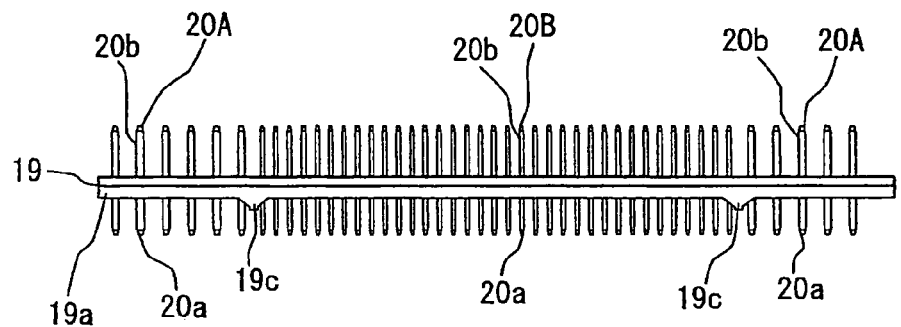
FIG. 9B is a front elevation view of the base shown in FIG. 9A.
Figure 9C:
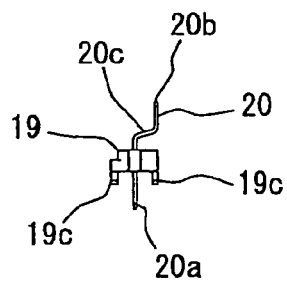
FIG. 9C is a side elevation view of the base shown in FIG. 2A.

FIG. 9 shows a second embodiment of the interconnection structure for the boards and terminal members.

In the second embodiment, the terminal support base 19 may be provided on one end (right end of the figure) in the longitudinal direction with five terminal guiding-holes 19b-1 and on the other end (left end of the figure) in the longitudinal direction with six terminal guiding-holes 19b-1. The terminal guiding-holes 19b-1 may be arranged in the terminal support base 19 so that the number of them may be different on the opposite end sides.

According to the above construction, the terminal support base 19 permits the plural terminal members 20 to penetrate and to be secured. The number of the terminal guiding-holes 19b-1, in which the wider terminal members 20A provided on the opposite longitudinal ends of the terminal support base 19 are inserted and secured, may be different at the opposite longitudinal ends of the terminal support base 19. Consequently, even if the terminal support base 19 is put on the first printed circuit board 13 in the position turned by an angle of about 180 degrees contrary to the regular position, the wider terminal members 20A fixed on the terminal support base 19 do not accord with the terminal holes 13a in the first printed circuit board 13, so that the wider terminal members 20 cannot be inserted into the terminal holes 13a in the first printed circuit board 13. Thus, it is possible to prevent the terminal members 20 in the erroneous arrangement from being connected to the conductors on the first printed circuit board 13.

Because the other construction and operational effects in the second embodiment may be the same as those in the first embodiment, explanations of them are omitted by giving the same signs to the same components.

Figure 10:
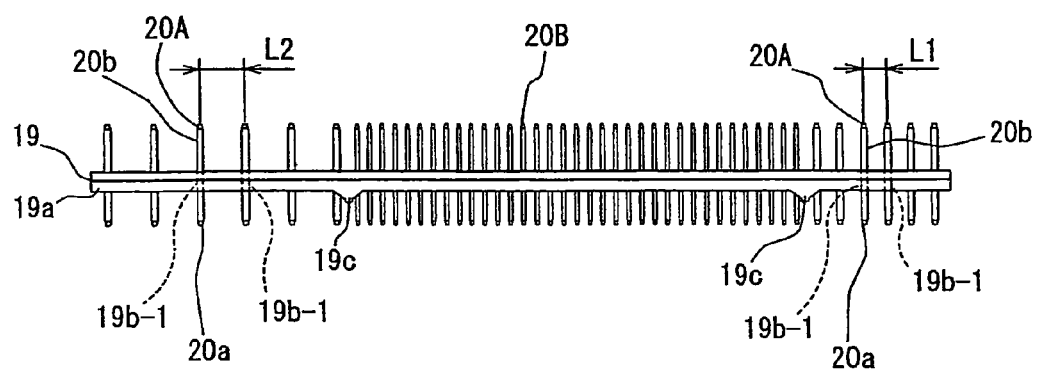
FIG. 10 is a front elevation view of a terminal support base according to a third embodiment, illustrating the view similar to FIG. 2B.

FIG. 10 shows a third embodiment of the interconnection structure for the boards and terminal members.

In the third embodiment, the narrower terminal members 20B may be disposed on an intermediate portion of the terminal support base 19 in the longitudinal direction, while the wider terminal members 20A are disposed on opposite end portions of the base 19 in the longitudinal direction. The number of the terminal guiding-holes 19b-1 for receiving and fixing the wider terminal members 20A may be the same on the opposite end portions of the terminal support base 19, such as six holes in the third embodiment. However, distances between the terminal guiding-holes 19b-1 on one end portion of the terminal support base 19 may be set to be L1, while distances between the terminal guiding-holes 19b-1 on the other end portion of the terminal support base 19 may be set to be L2 (L1<L2). Thus, the distances on the opposite end portions of the terminal support base 19 may be different.

According to the above construction, the distances between the terminal guiding-holes 19b-1 may be different at the opposite end portions of the terminal support base 19 and thus the distances between the terminal members 20A are different. Consequently, even if the terminal support base 19 is put on the first printed circuit board 13 in the position turned by an angle of about 180 degrees contrary to the regular position, the wider terminal members 20A fixed on the terminal support base 19 do not depend on the terminal holes 13a in the first printed circuit board 13, so that the wider terminal members 20A cannot be inserted into the terminal holes 13a in the first printed circuit board 13. Thus, it is possible to prevent the terminal member 20 in the erroneous arrangement from being connected to the conductors on the first printed circuit board 13.

Because the other construction and operational effects in the third embodiment may be the same as those in the first embodiment, explanations of them are omitted by giving the same signs to the same components.

Figure 11:
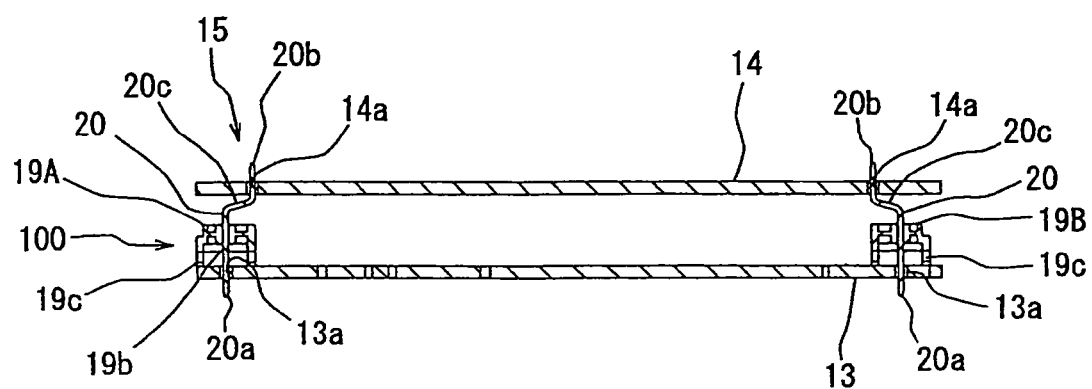
FIG. 11 is a sectional view of a fourth embodiment of the interconnection structure for circuit boards and terminal members, illustrating the view similar to FIG. 1C.

FIG. 11 shows a fourth embodiment of the interconnection structure for the boards and terminal members.

In the fourth embodiment, the same terminal support base 19 as that in the first embodiment may be opposed to each of lateral side end portions of the first printed circuit board 13.

One terminal support base 19A may be disposed at a position turned by an angle of about 180 degrees relative to the other terminal support base 19B in a horizontal plane. Consequently, bending directions of the bent portions 20c of the terminal members 20 disposed on the opposite ends of the terminal support bases 19A and 19B may be symmetrical with respect to the center of the first printed circuit board 13.

According to the above construction, as in the case with first embodiment, it is possible to prevent the soldered portions interconnecting the terminal members 20 and the conductors on the first and second printed boards 13 and 14 from a problem, such as cracking. It is also possible to reduce a count of components and lower a cost by changing the terminal support bases 19 disposed on the opposite lateral end side portions of the first and second printed circuit boards 13 and 14 to the same terminal support base.

The same terminal support base as that in the second or third embodiment may be disposed on both sides of the printed boards.

Because the other construction and operational effects in the fourth embodiment are the same as those in the first embodiment, explanations of them are omitted by giving the same signs to the same components.

What is claimed is:

1. An interconnection structure for boards and terminal members comprising:
   two circuit boards positioned away from each other;
   a terminal support base disposed on at least one of said two circuit boards and provided with a plurality of juxtaposed terminal guiding-holes; and
   a plurality of terminal members soldered to conductors on said two circuit boards, penetrating said terminal guiding-holes in said terminal support base, and provided with bent portions for stress relaxation at a position where said bent portions do not contact with said terminal support base, wherein,
   the bent portions are inclined with respect to soldered portions at opposite connecting ends of the terminal members, and the bent portions are disposed between said two circuit boards.

2. The interconnection structure for boards and terminal members according to claim 1, wherein said terminal guiding-holes juxtaposed in said terminal support base are arranged in a different pattern at opposite longitudinal end portions of said terminal support base.

3. The interconnection structure for boards and terminal members according to claim 2, wherein said terminal support base is disposed on each of the opposite lateral end portions of said boards,
   the same terminal support bases are opposed to each other at the opposite lateral end portions of said boards, and
   one of said terminal support bases is turned by an angle of 180 degrees relative to the other terminal support base.

* * * * *